(12) United States Patent
Halbert et al.

(10) Patent No.: US 9,761,298 B2
(45) Date of Patent: *Sep. 12, 2017

(54) METHOD, APPARATUS AND SYSTEM FOR RESPONDING TO A ROW HAMMER EVENT

(71) Applicant: Intel Corporation, Santa Clara, CA (US)

(72) Inventors: John B. Halbert, Beaverton, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/364,123

(22) Filed: Nov. 29, 2016

(65) Prior Publication Data
US 2017/0092350 A1 Mar. 30, 2017

Related U.S. Application Data

(63) Continuation of application No. 15/011,286, filed on Jan. 29, 2016, now Pat. No. 9,564,201, which is a
(Continued)

(51) Int. Cl.
*G11C 11/406* (2006.01)
*G06F 3/06* (2006.01)
*G06F 12/06* (2006.01)

(52) U.S. Cl.
CPC ...... *G11C 11/40618* (2013.01); *G06F 3/0616* (2013.01); *G06F 3/0659* (2013.01); *G06F 3/0673* (2013.01); *G06F 12/0646* (2013.01)

(58) Field of Classification Search
CPC .................................................. G11C 11/406
(Continued)

(56) References Cited

U.S. PATENT DOCUMENTS 9,286,964 B2 * 3/2016 Halbert ............. G11C 11/40603
9,564,201 B2 * 2/2017 Halbert ............. G11C 11/40603
(Continued)

FOREIGN PATENT DOCUMENTS

CN        102655023 A     9/2012
JP        2003016781 A    1/2003
(Continued)

OTHER PUBLICATIONS

English Translation of State Intellectual Property Office, P.R. China. Office Action, Patent Application No. 201380060811.4 received Dec. 6, 2016, 9 pages.
(Continued)

*Primary Examiner* — Min Huang
(74) *Attorney, Agent, or Firm* — Compass IP Law PC

(57) ABSTRACT

Techniques and mechanisms to facilitate an operational mode of a memory device to prepare for a targeted refresh of a row in memory. In an embodiment, the memory device performs one or more operations while in the mode to prepare for a future command from a memory controller, the command to implement, at least in part, a targeted refresh of a row in a first bank of the memory device. Prior to such a command, the memory device services another command from the memory controller. In another embodiment, servicing the other command includes the memory device accessing a second bank of the memory device while the memory device operates in the mode, and before completion of an expected future targeted row refresh.

38 Claims, 8 Drawing Sheets

Related U.S. Application Data continuation of application No. 13/725,800, filed on Dec. 21, 2012, now Pat. No. 9,286,964.

(58) Field of Classification Search
USPC .......................................................... 365/222
See application file for complete search history.

(56) References Cited

U.S. PATENT DOCUMENTS

| | | |
|---|---|---|
| 2003/0007406 A1 | 1/2003 | Kyung |
| 2003/0167428 A1 | 9/2003 | Gold |
| 2005/0071543 A1* | 3/2005 | Ellis .................... G06F 13/1636 711/106 |
| 2005/0099868 A1 | 5/2005 | Oh |
| 2005/0243627 A1 | 11/2005 | Lee et al. |
| 2005/0276142 A1 | 12/2005 | Pelley |
| 2008/0151669 A1* | 6/2008 | Bill ....................... G11C 11/406 365/222 |
| 2008/0165605 A1* | 7/2008 | Fisch .................... G11C 11/406 365/222 |
| 2008/0253212 A1* | 10/2008 | Iida ....................... G11C 11/406 365/222 |
| 2009/0116326 A1 | 5/2009 | Lee |
| 2010/0074042 A1 | 3/2010 | Fukuda et al. |
| 2010/0172200 A1 | 7/2010 | Kawakubo et al. |
| 2011/0219197 A1 | 9/2011 | Perego et al. |
| 2011/0255357 A1 | 10/2011 | Pelley et al. |
| 2013/0304982 A1 | 11/2013 | Jung et al. |
| 2014/0003173 A1* | 1/2014 | Ku ......................... G11C 29/04 365/200 |
| 2014/0006703 A1 | 1/2014 | Bains et al. |
| 2014/0006704 A1 | 1/2014 | Greenfield et al. |
| 2014/0059287 A1 | 2/2014 | Bains et al. |
| 2014/0085995 A1 | 3/2014 | Greenfield et al. |
| 2014/0089576 A1 | 3/2014 | Bains et al. |
| 2014/0095947 A1 | 4/2014 | Mozak et al. |
| 2014/0164823 A1* | 6/2014 | Zheng ................. G06F 11/2053 714/6.11 |
| 2014/0229699 A1* | 8/2014 | Gurgi .................. G06F 13/1626 711/167 |
| 2015/0187406 A1* | 7/2015 | Kim ..................... G11C 11/4076 365/194 |
| 2015/0200002 A1* | 7/2015 | Lin ....................... G11C 7/1072 711/106 |

FOREIGN PATENT DOCUMENTS

| | | |
|---|---|---|
| WO | 2004034401 A2 | 4/2004 |
| WO | 2010085405 A1 | 7/2010 |
| WO | 2012074724 A1 | 6/2012 |
| WO | 2014099031 A1 | 6/2014 |

OTHER PUBLICATIONS

English Translation of the Notice of Preliminary Rejection, Application No. 10-2016-7034444, Mailed Dec. 16, 2016, 3 pages.
International Search Report and Written Opinion received for PCT Patent Application No. PCT/US2013/048653, mailed on Oct. 22, 2013, 11 pages.
International Preliminary Report on Patentability, PCT/US2013/048653, Mailed Jul. 2, 2015, 7 pages.

* cited by examiner

METHOD, APPARATUS AND SYSTEM FOR RESPONDING TO A ROW HAMMER EVENT

PRIORITY

This Application is a Continuation of and claims the benefit of priority of U.S. patent application Ser. No. 15/011,286, filed Jan. 29, 2016, which in turn is a Continuation of and claims the benefit of priority of U.S. patent application Ser. No. 13/725,800, filed Dec. 12, 2012.

BACKGROUND

1. Technical Field

Embodiments of the invention are generally related to memory management, and more particularly to the control of memory refresh operations.

2. Background Art

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With successive generations of increasingly dense memory devices, intermittent failures have become more frequent. For example, some existing DDR3 based systems experience intermittent failures with heavy workloads. Researchers have traced the failures to repeated access to a single row of memory within the refresh window of the memory cell. For example, for a 32 nm process, if a row is accessed 550K times or more in the 64 millisecond refresh window, the physically adjacent wordline to the accessed row has a very high probability of experiencing data corruption. The row hammering or repeated access to a single row can cause migration across the passgate. The leakage and parasitic currents caused by the repeated access to one row cause data corruption in a non-accessed physically adjacent row. The failure issue has been labeled as a 'row hammer' or 'row disturb' issue by the DRAM industry where it is frequently seen.

Recently, targeted row refresh technologies have been introduced to mitigate the effects of row hammering. Various operations to facilitate targeted row refreshes tend to complicate the timing of other processes in a memory subsystem. As memory technologies continue to scale, it is expected that reliance on targeted row refresh techniques increase. This increased reliance poses a challenge to protecting the performance of DRAM and other types of memory systems.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms to facilitate a targeted refresh specific to a row of memory in a memory device. The row to be refreshed may, for example, be at risk of being a victim of row hammering at an adjacent target row. In an embodiment, a dynamic random access memory (DRAM) or other memory device detects an indication—e.g. received from a memory controller coupled thereto—that a particular target row is subject to row hammering.

In response to such an indication, the memory device may operate in a mode which facilitates preparations for an expected future—but, in an embodiment, not yet received—command to perform one or more operations for implementing a targeted row refresh. While operating in the mode, the memory device may keep track of a particular bank which includes the target row and one or more victim rows physically adjacent to the target row. While in the mode, but after preparations for a targeted row refresh have begun, the memory device may support access—e.g. read access, write access, etc.—to another bank or banks of the memory device which do not include the target row and victim row(s). In an embodiment, the memory device automatically exit the mode after an indication that all expected targeted row refreshes which are associated with the detected hammer event have been performed.

Figure 1:
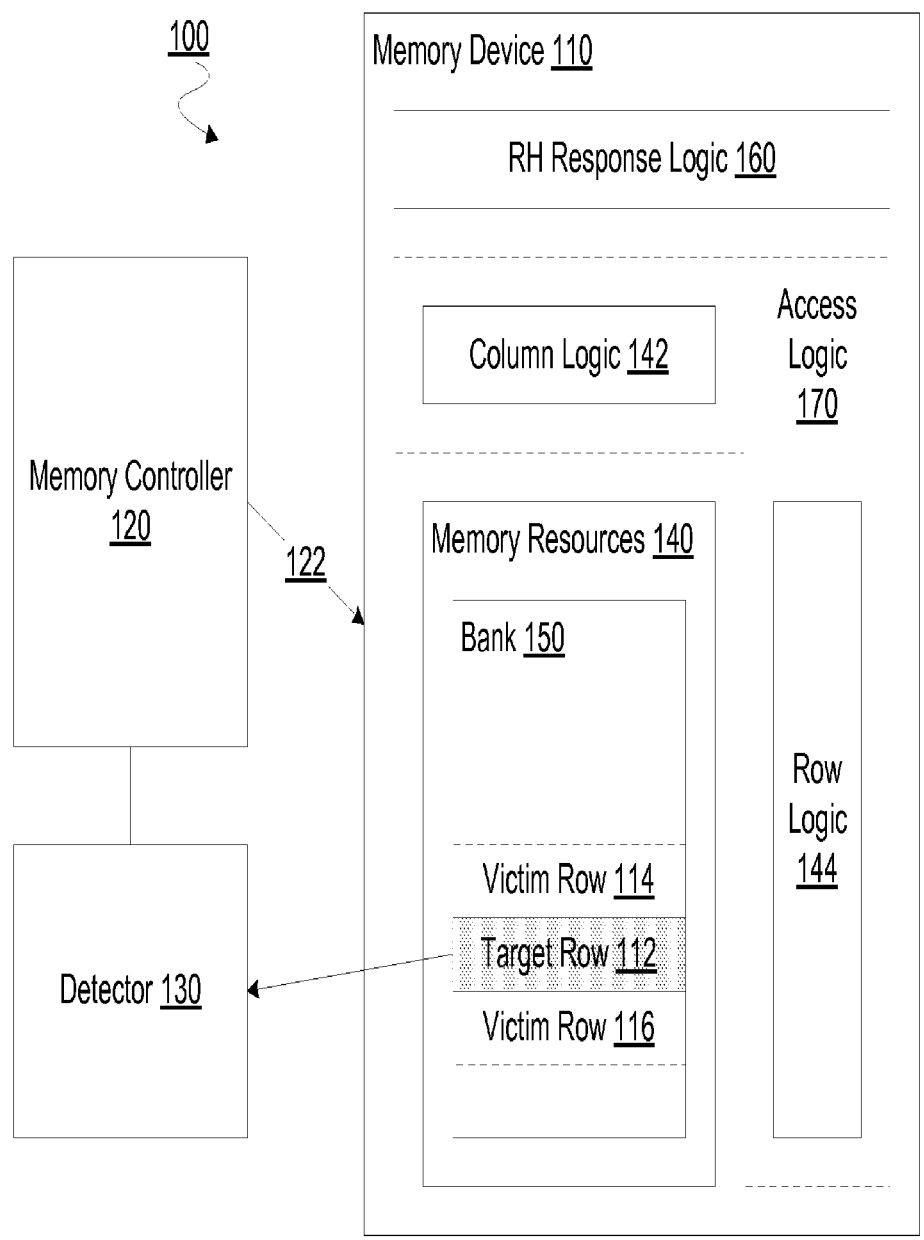
FIG. 1 is a block diagram illustrating element of a system for performing a targeted refresh according to an embodiment.

FIG. 1 illustrates elements of a system 100 for implementing a targeted row refresh according to an embodiment. System 100 may include memory device 110 coupled to memory controller 120. Memory device 110 may include any of a variety of types of memory technology that have adjacent rows of memory cells, where data is accessible via a wordline or the equivalent. In one embodiment, memory device 110 includes dynamic random access memory (DRAM) technology. Memory device 110 may be an integrated circuit package within a larger memory device (not shown) of system 100. For example, memory device 110 may be a DRAM device of a memory module such as a dual in-line memory module (DIMM).

Memory device 110 may include memory resources 140, which represents one or more logical and/or physical groups of memory. An example of one such grouping of memory is a bank 150 of memory resources 140. Bank 150 may include an array of storage elements arranged in rows and columns. By way of illustration and not limitation, bank 150 may include row 112 and one or both of rows 114, 116 physically adjacent to row 112. There is no requirement for the number of rows and columns of a given bank to be equal, and in fact they are typically not equal.

In an embodiment, memory resources 140 comprise a plurality of banks including bank 150. Some or all of such a plurality of banks may, for example, be disposed on a single integrated circuit chip (not shown) of memory device 110. In an embodiment, the plurality of banks consist of banks in an integrated circuit package—e.g. of a 3D stacked memory device wherein the banks variously reside on a different chips of an IC chip stack.

Memory device 110 may include access logic 170 to facilitate, at least in part, access to memory resources 140—e.g. where such access if provided for servicing one or more commands from memory controller 120. Access logic 170 may include, or operate in conjunction with, logic of memory device 110 which provides resource access according to conventional techniques—e.g. where functionality of access logic 170 supplements such conventional techniques with additional functionality discussed herein. By way of illustration and not limitation, access logic 170 may include or couple to column logic 142 and row logic 144, which are used to decode an access instruction to the proper memory location within bank 150. Column logic 142 and/or row logic 144 may further provide functionality for accessing one or more other banks of memory resources 140.

Memory controller 120 may send commands or instructions to memory device 110 over a command bus (e.g., a command/address (C/A) bus), which are then interpreted by memory device 110. Memory device 110 may decode the command information to perform a variety of access functions within the memory, and decode address information via column logic 142 and row logic 144. The logic may access a specific location in memory with a combination of a column address strobe or signal (CAS) and a row address strobe or signal (RAS). Rows of memory may be implemented in accordance with known memory architectures or their derivatives. Briefly, a row of memory may include one or more addressable columns of memory cells, as identified by the CAS generated by column logic 142. The rows may each be variously addressable via the RAS generated by row logic 144.

Memory resources 140 may include one or more rows that, during some operation of memory device 100, are the targets of repeated access within a time window. Such a row may be subject to a row hammer condition. In many modern memory devices, the architecture of the semiconductor layout causes one or more physically adjacent rows to be at risk of becoming corrupted. The row or rows at risk of becoming corrupted due to row hammer condition are referred to herein as victim rows. At a given time during operation of system 100, memory resources 140 may include target row 112 of bank 150, which is a row of memory subject to hammering, or being accessed repeatedly within a given time period. The target row 112 is the target of the row hammer event. The one or more rows at risk of becoming corrupted due to row hammer of target row 112 are illustrated with victim row 114 and victim row 116 of bank 150. Either or both of victim rows 114, 116 may be at risk, depending on the physical layout of memory device 110.

It will be understood that different memory device manufacturers use different logic and architectures to utilize the memory resources of the devices. For example, different memory device manufacturers may use different offsets to map between logical memory addresses used in a host processor and the physical memory addresses used internally to memory device 110. In one embodiment, memory controller 120 utilizes the same logical memory addresses as used by a host processor (not shown) of system 100. Thus, in one embodiment, memory controller 120 may provide a row address to memory device 110 indicating a particular row. The memory controller 120 may indicate the row address in conjunction with and/or as part of a command that it issues to memory device 110.

However, in certain applications, memory controller 120 may not have access to a physical address of target row 112 and/or information describing, for example, the address offset between target row 112 and one or each of the physically adjacent victim rows 114, 116. Moreover, in the absence memory controller 120 specifying an address of victim row 114 or victim row 116, memory device 110 may not include logic to identify that victim row 114 or victim row 116 is to be a target of a targeted refresh to address hammering of target row 112.

In an embodiment, memory controller 120 generates, in response to detecting a row hammer event, one or more commands 122 for causing memory device 110 to perform one or more targeted refreshes each of a respective row. In one embodiment, one or more commands 122 include a command or sequence of commands for refreshing a particular row of memory resources 140. For example, in one embodiment, such a sequence may include an Activate command specifying activation of a potential victim row, followed by a Precharge command for that same potential victim row. Any of a variety of additional or alternative commands which explicitly specify such a potential victim row may be included in one or more commands 122, according to different embodiments.

Detector 130 represents hardware and/or software or other logic that enables system 100 to detect a row hammer event. The mechanism or mechanisms used to detect the row hammer condition may not be limiting on certain embodiments. In an embodiment, detector 130 determines when target row 112 experiences repeated accesses within a threshold. Detector 130 may include hardware and/or logic at memory device 110, memory controller 120, and/or external to either or both of memory device 110 and memory controller 120.

The mechanisms of detector 130 may include, for example, some way of determining a number of times a row is accessed, as well as determining the period of time in which the accesses occur. The row hammer event may not simply be about how many times a row is accessed, but how many times in a given time period. Once a row is refreshed, the conditions that could cause data corruption may be overcome. Thus, the time period for the monitoring should, in an embodiment, be based at least in part on the refresh rate. An exchange of one or more commands 122, to overcome conditions that would otherwise cause data corruption, may take place in between normally scheduled refresh event that may occur periodically on a refresh cycle.

Memory device 110 may further include row hammer (RH) response logic 160 to perform one or more operations which facilitate performance of a targeted refresh. In response to detector 130 detecting an indication of a row hammer event, memory device 110 may be configured for operation in a mode for memory device 110 to prepare for servicing some or all of the one or more commands 122. For example, based on configuration of memory device 110 to operate in such a mode, RH response logic 160 may perform one or more operations which facilitate a later performance of one or more targeted refreshes each of a respective victim row—e.g. a respective one of victim rows 114, 116. In an embodiment, the one or more operations are performed by RH response logic 160 before memory device 110 receives some, or any, of one or more commands 122.

The one or more operations performed by RH response logic 160 may include, for example, activating circuitry— e.g. in access logic 170—to prevent one or more types of access to memory resources 140 which might interfere with, delay or otherwise affect operations to implement a targeted row refresh. By way of illustration and not limitation, RH response logic 160 may signal that read access and/or write access to bank 150 is to be prevented at least temporarily.

Alternatively or in addition, the one or more commands performed by RH response logic 160 may include determining address information for a victim row (or victim rows) associated with a target row which is being hammered. Determining such address information may include performing a search or calculation to generate a result identifying an address, an address offset, an address mapping and/or the like as corresponding to a victim row for the detected row hammer event. Such a result may be available for use before memory device 110 receives a particular command which is to trigger such use to facilitate a targeted row refresh.

While memory device 110 is configured for operation in such a mode—e.g. during or after operations to prepare for a targeted refresh of a row in bank 150, but before memory controller 120 subsequently triggers the targeted refresh—memory device 110 may support access to one or more banks (not shown) of memory resources 140 other than bank 150. For example, access logic 170 may be configured to selectively block read access and/or write access to bank 150, but to allow such read access and/or write access to another bank or banks of memory resources 140.

Figure 2:
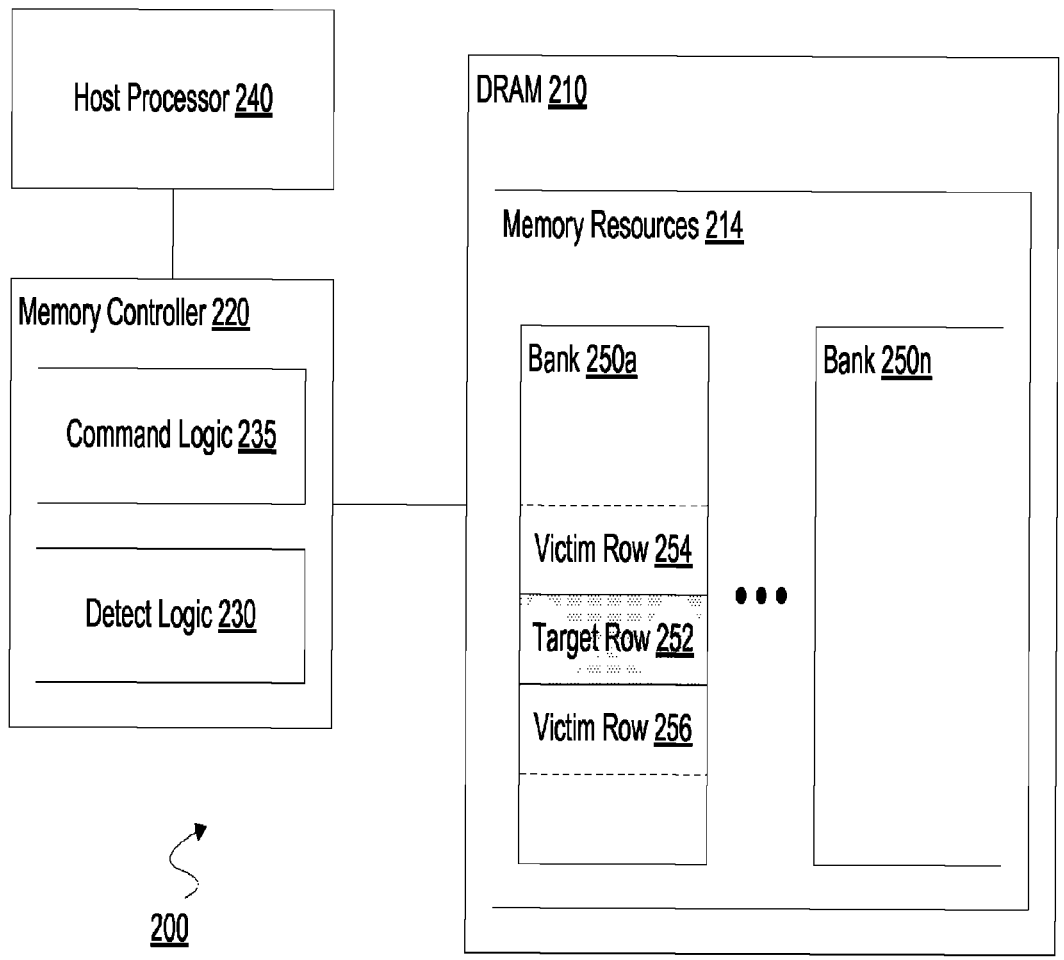
FIG. 2 is a block diagram illustrating element of a system for responding to a row hammer event according to an embodiment.

FIG. 2 illustrates elements of a system 200 according to an embodiment for performing operations in preparation for a targeted row refresh. System 200 may include a memory device coupled to host processor 240 via memory controller 220, and can be one example of a system in accordance with system 100 of FIG. 1. By way of illustration and not limitation, system 200 includes memory device DRAM 210 coupled to memory controller 220. Memory controller 220 may be coupled in turn to host processor 240.

Host processor 240 may be any type of processing unit, processor, or microcontroller. Host processor 240 may perform the primary execution of operations in system 200. In an embodiment, some or all operations executed by host processor 240 originate from instructions and/or data stored in DRAM 210. DRAM 210 may be a memory device in accordance with any of various embodiments described herein. DRAM 210 may include memory resources 214 comprising, for example, some or all of the features of memory resources 140. In one embodiment, DRAM 210 is a volatile memory, or a memory device whose contents are non-deterministic if power is interrupted to the device. Thus, a volatile memory requires a regular power source to allow it to refresh the memory cells to keep the data from become lost or corrupted.

DRAM 210 may include hardware connectors (not shown) that interface with corresponding hardware connectors (not shown) of memory controller 220. Memory access from host processor 240 typically goes through memory controller 220. In one embodiment, memory controller 220 is part of host processor 240. In an alternate embodiment, memory controller is part of a supporting "chipset" or hardware logic that provides an infrastructure for power and interface logic for a hardware platform of which host processor 240 is a part.

Certain embodiments are implemented entirely within a memory controller including some or all of the features of memory controller 220. As mentioned above, a detector may enable memory controller 220 to identify a row hammer condition to be able to respond to the row hammer condition with one or more commands for implementing a targeted refresh. Detect logic 230 is illustrated as being part of memory controller 220, and represents some or all of the logic needed to detect row hammering in system 200. Memory controller 220 may further include command logic 235, which represents hardware, software or other logic for memory controller 220 to perform its functions of managing memory access to DRAM 210.

DRAM 210 may include logic (not shown), such as that of RH response logic 160, to perform one or more operations in preparation for an expected future implementation of a targeted row refresh. In response to detect logic 230 detecting an indication of a row hammer event, command logic 235 may send one or more commands to configure a particular operational mode of DRAM 210. In response to being so configured, DRAM 210 may prepare at least in part for performance of a targeted refresh—e.g. where such preparations are performed before command logic 235 subsequently triggers DRAM 210 to perform the targeted refresh.

While DRAM 210 is configured for operation in the mode, command logic 235 may send to DRAM 210 a command to access a particular bank of memory resources 214. DRAM 210 may service the request after the one or more operations which are in preparation for the targeted row refresh, but before the memory controller triggers the DRAM 210 to perform the targeted row refresh. In an embodiment, servicing the request includes performing an access—e.g. including a read access and/or a write access—of a bank other than a bank which is to be accessed by the targeted row refresh.

In an illustrative scenario according to one embodiment, memory resources 214 includes a plurality of banks 250a, . . . , 250n, where bank 250a includes a row 252 and at least one other row—illustrated by rows 254, 256—which is physically adjacent to row 252. At some point in time during operation of system 200, detect logic 230 may receive an indication that row 252 is a target of row hammering which poses a threat to data integrity in either or both of victim rows 254, 256. In response to detect logic 230 detecting hammering of target row 252, command logic 235 may send a command—e.g. a mode register set (MRS) command—to place DRAM 210 into a mode for facilitating a future targeted refresh of either of victim rows 254, 256.

In response to being placed in such a mode, DRAM 210 may prepare at least in part for an expected future targeted row refresh—e.g. where such preparations are completed before memory controller 220 subsequently sends to DRAM 210 a command addressed to or otherwise targeting a victim row. In a time between DRAM 210 being set in the mode and the triggering of DRAM 210 to perform the targeted refresh, memory controller may send one or more commands to access another bank of memory resources 214, such as bank 250n. DRAM 210 may service the command before memory controller 220 triggers a targeted refresh of victim row 254 (or of victim row 256).

Figure 3:
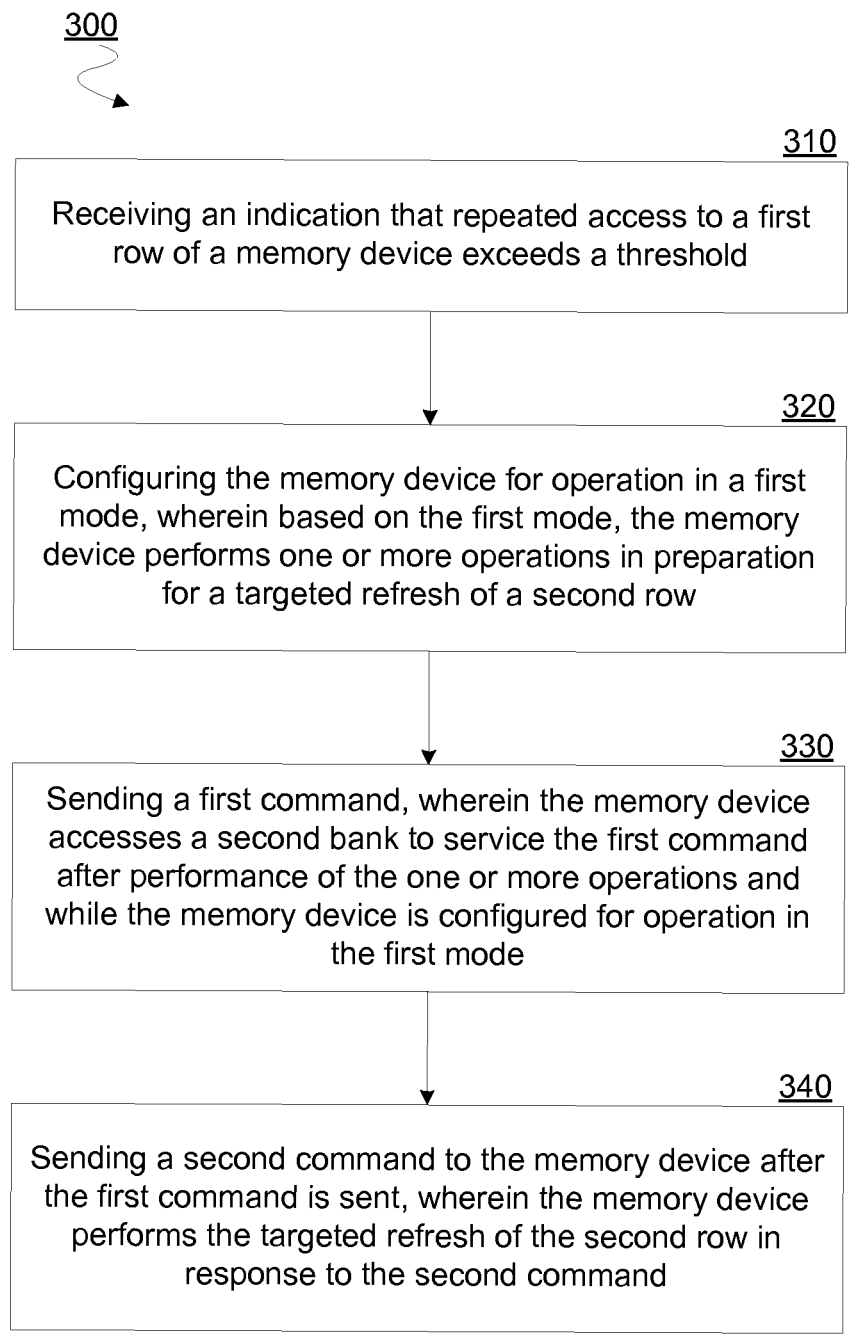
FIG. 3 is a flow diagram illustrating elements of a method for controlling a memory device according to an embodiment.

FIG. 3 illustrates elements of a method 300 for controlling a memory device according to an embodiment. Method 300 may be performed by a memory controller including some or all of the features of memory controller 220, for example. In an embodiment, method 300 is performed to control a memory device, such as memory device 110, which includes a first bank and a second bank, the first bank including a first row and a second row physically adjacent to the first row. In an embodiment, an integrated circuit chip of the memory device includes both the first bank and the second bank.

Method 300 may include, at 310, receiving an indication that repeated access to the first row of the memory device exceeds a threshold. The indication may include any of a variety of indicia of a row hammer event including, but not limited to, a command from a host, a control signal from the memory device, a signal exchanged between detect logic and command logic of the memory controller, and/or the like. By way of illustration and not limitation, detect logic of the memory controller maintain or otherwise keep track of a count of accesses of the first row and/or an amount of time over which such accesses takes place. At a given time—e.g. at one of a plurality of scheduled intervals—the detect logic may compare a current count of the accesses to a threshold number. Based on the comparison, the detect logic of the memory controller may identify that the threshold has been exceeded. Alternatively, the memory device may include this or other such detect logic, where the memory device communicates to the memory controller that a threshold number of accesses to the first row has been exceeded. Certain embodiments are not limited with respect to the particular mechanism by which the indication received at 310 might be generated.

In an embodiment, method 300 includes, at 320, configuring the memory device for operation in a first mode in response to the indication received at 310. Based on the first mode, the memory device may perform one or more operations in preparation for a targeted refresh of the second row. By way of illustration and not limitation, command logic of the memory controller may send a MRS command to write configuration information to one or more mode registers of the memory device.

Such configuration information may include one or more bit values to enable the operational mode. In an embodiment, the configuring at 320 includes writing to a mode register an identifier of the bank—e.g. the first bank—which is the target of the indicated row hammering. For brevity, the term "reference bank" is used herein to indicate a bank which is being subject to a particular instance of row hammering. The identifier of the reference bank may, for example, be provided to the memory device in an MRS command, a next command subsequent to such an MRS command, or in some other signaling which the memory device is configured to recognize as being associated with the instance of the mode set at 320.

Method 300 may further include, at 330, sending a first command, wherein the memory device accesses the second bank to service the first command after performance of the one or more operations. The accessing of the second bank to service the first command is also while the memory device is configured for operation in the first mode. In an embodiment, the first command is for a type of access—e.g. including read access and/or a write access—which, at the time of first command is serviced, the memory device provides for the second bank but not for the first bank. Such selective restriction of access to the first bank may be based on the mode of the memory device which is configured at 320.

In an embodiment, method 300 further includes, at 340, sending a second command to the memory device after the first command is sent, wherein the memory device performs the targeted refresh of the second row in response to the second command. The second command may include, for example, one of an Activate command specifying activation of the second row, and a Precharge command for the second row.

Figure 4:
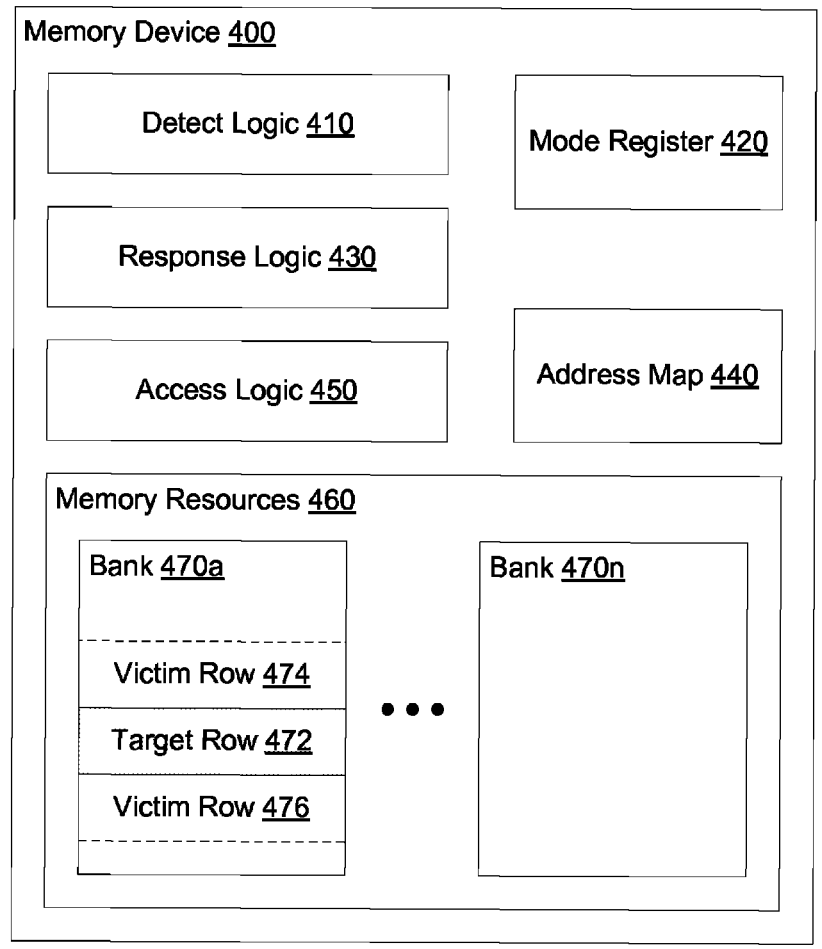
FIG. 4 is a block diagram illustrating elements of a memory device for responding to a row hammer event according to an embodiment.

FIG. 4 illustrates elements of a memory device 400 for performing a targeted row refresh according to an embodiment. Memory device 400 may include some or all of the features of memory device 110, for example.

Memory device 400 may include memory resources 460 comprising a plurality of banks 470a, . . . , 470n. Two or more banks of memory resources 460—e.g. including banks 470a, 470n—may each be included in a single integrated circuit chip of memory device 400. In an embodiment, bank 470a includes a row 472 and one or more other rows, represented by the illustrative rows 474, 476, which are each physically adjacent to target row 472. In an illustrative scenario according to one embodiment, some row of memory resources 460—e.g. row 472—may be subject to row hammering which poses a risk to data integrity of one or more adjacent rows. In such a scenario, row 472 may be considered a target row and one or each of adjacent rows 474, 476 may be considered a victim row.

Memory device 400 may further include detect logic 410 which, in response to detection of a row hammer event, is to configure the memory device for operation in a first mode. By way of illustration and not limitation, detect logic 410 may receive an indication that repeated access to the target row 472 exceeds a threshold. The indication may include, for example, a MRS command which memory device 400 receives from a memory controller (not shown). Configuring memory device 400 may include, for example, detect logic 410 writing to a mode register 420 configuration information to specify enablement of the first mode. Alternatively of in addition, detect logic 410 may store to mode register 420 information to identify bank 470a as being the reference bank for one or more expected future targeted row refresh. Memory device 400 may further include response logic 430—e.g. including some or all of the features of RH response logic 160—to operate based on the first mode. In an embodiment, such operation includes response logic 430 performing, in response to the indicated hammering of target row 472, one or more operations which aid in preparation for a targeted refresh of victim row 474 and/or a targeted refresh of victim row 476.

By way of illustration and not limitation, response logic 430 may perform operations to lock bank 470a from one or more types of access which might otherwise impede or are not in the service of, performing a targeted row refresh. Alternatively or in addition, response logic 430 may search for, calculate and/or otherwise identify address information for a victim row based, for example, on an address of the identified target row 472. In an embodiment, memory device 400 includes or otherwise has access to an address map 400 for use in identifying such address information. For example, response logic 430 may perform a lookup of reference information in address map 440 to identify an offset in logical addressing between physically adjacent rows, an assignment of a logical address to a redundant row in memory and/or any other such information for determining a physical address of victim row 474 and/or a physical address victim row 476.

Memory device 400 may further include access logic 450 to service a first command after performance of the one or more operations, where memory device 400 receives the first command from a memory controller. The first command may, for example, include a write command, read command, or other such command to access one or more rows of bank 470n. Servicing the first command may include access logic 450 accessing bank 470n while memory device 400 is configured for operation in the first mode. In an embodiment, access logic 450 further performs a targeted refresh of a victim row of bank 470a—e.g. one or victim rows 474, 476—in response to a second command which the memory device receives from the memory controller after the first command.

Figure 5:
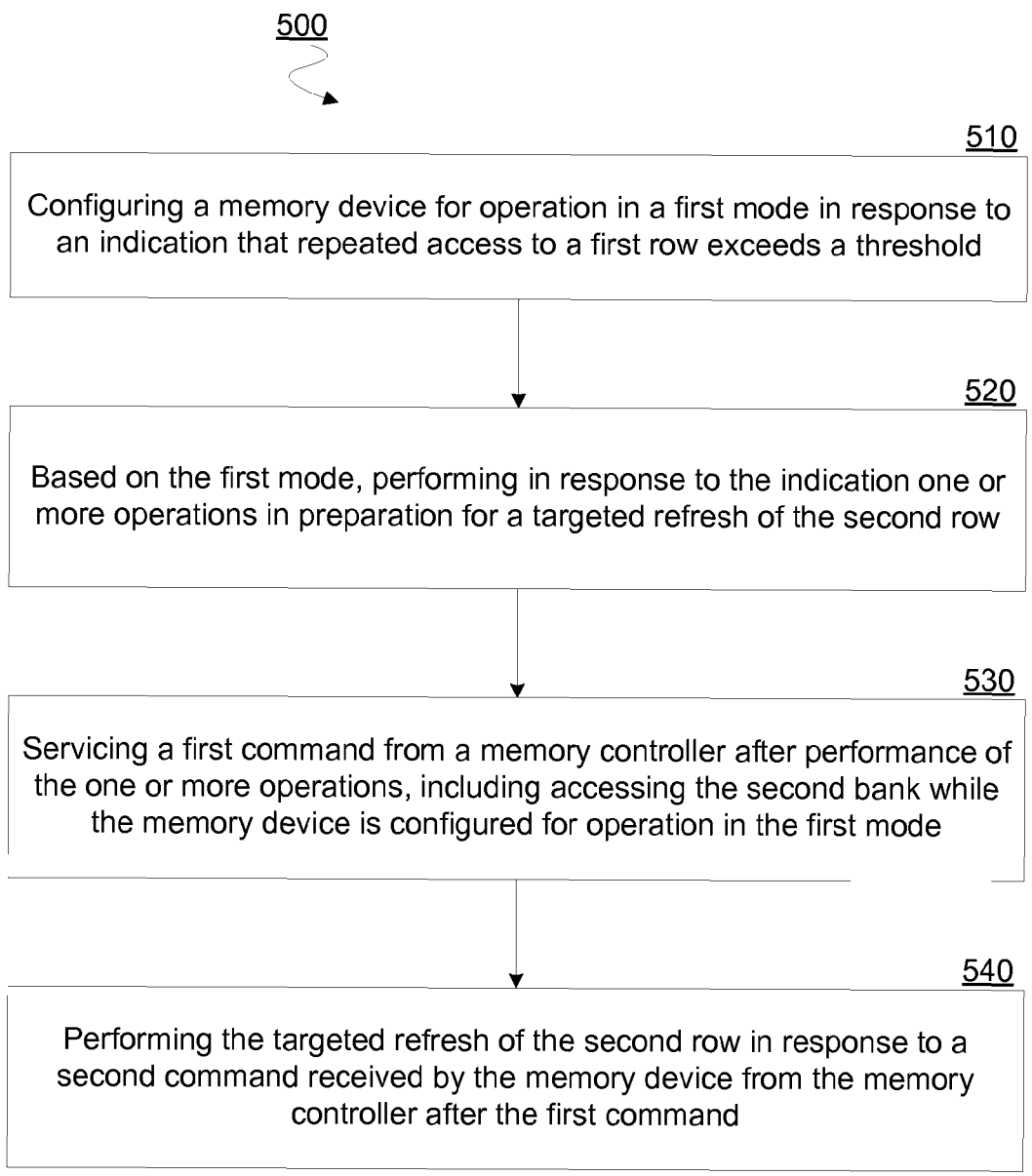
FIG. 5 is a flow diagram illustrating elements of a method for operating a memory device according to an embodiment.

FIG. 5 illustrates elements of a method 500 for operating a memory device according to an embodiment. Method 500 may be performed by a memory device including some or all of the features of memory device 110, for example.

In an embodiment, method 500 includes, at 510, configuring the memory device for operation in a first mode. The memory device may comprise a first bank and a second bank, where the first bank includes a first row and a second row physically adjacent to the first row. In an embodiment, an integrated circuit chip of the memory device includes the first bank and the second bank. The configuring at 510 may be in response to an indication that repeated access to some row of the first bank—e.g. the first row—exceeds a threshold.

Based on the configured first mode, method 500 may further include, at 520, performing one or more operations in preparation for a targeted refresh of the second row, the one or more operations in response to the indication. The one or more operations may include, for example, activating logic to restrict an access to the first bank other than an access for a targeted refresh. Alternatively or in addition, the one or more operations may include determining address information corresponding to the second row. By way of illustration and not limitation, determining such address information may include accessing address map information to determine an address offset, a redundant row address and/or the like. The address map information may specify, for example, an offset between physically adjacent rows of the memory device.

After performance of the one or more operations at 520, method 500 may further comprise, at 530, servicing a first command from a memory controller, including accessing the second bank while the memory device is configured for operation in the first mode. In an embodiment, method 500 further includes, at 540, performing the targeted refresh of the second row. Performance of the targeted row refresh at 540 may be in response to a second command received by the memory device from the memory controller after the first command. In an embodiment, method 500 further includes the memory device maintaining a count of accesses to the first bank subsequent to the mode being set. For example, circuitry such as that of response logic 430 may maintain such a count to keep track of whether all expected targeted row refreshes, associated with the hammering of the first row, have been completed. In response to the count reaching a threshold value—indicating all victim rows have been refreshed—the memory device may automatically reconfigure itself to discontinue operation according to the mode.

Figure 6:
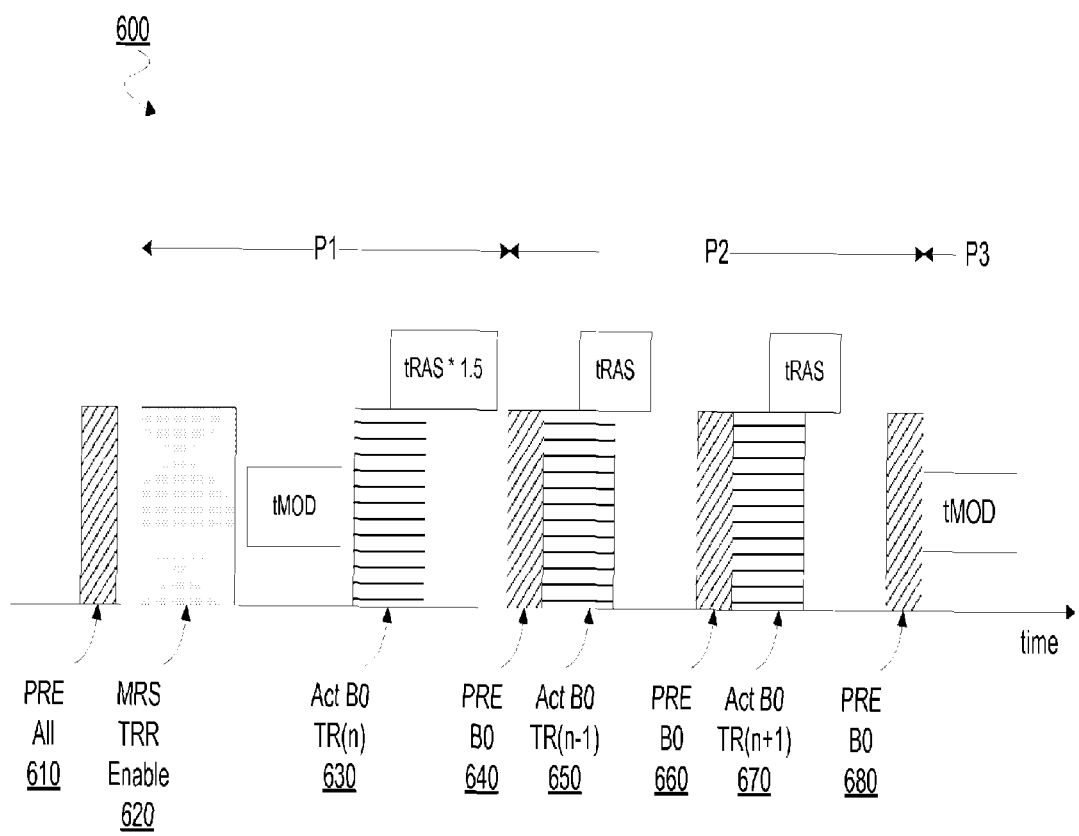
FIG. 6 is a timing diagram illustrating an exchange between a memory controller and a memory device according to an embodiment.

FIG. 6 is a timing diagram 600 illustrating an exchange of commands from a memory controller to a memory device according to an embodiment. Timing diagram 600 may represent an exchange from memory controller 120 to memory device 110, for example.

In timing diagram 600, PRE All 610 represents a command to precharge all banks of the memory device prior to enablement of a mode to prepare for a future targeted row refresh. MRS TRR enable 620 represents a mode register set command to place the memory device in such a mode. By way of illustration and not limitation, MRS TRR enable 620 may set in a mode register MR2 of the memory device a bit A11 which is for specifying a state of activation of the mode. The arrangement of information in MR2 (or other such mode register) may be set forth in a synchronous DRAM (SDRAM) standard which, for example, is compatible in one or more respects with DDR3, DDR4 or other such standard of the Joint Electron Devices Engineering Council (JEDEC). MRS TRR enable 620 may further write information—e.g. to bits A8 and A2:A0 of MR2—to specify a particular bank as being the reference bank for the current instance of the mode. In an alternate embodiment, the reference bank is identified to the memory device by an address associated with another command—e.g. an activate command—which is immediately subsequent to the MRS TRR enable 620.

In the illustrative exchange of timing diagram 600, such a subsequent command is represented by Act B0 TR(n) 630, which activates the target row n in reference bank B0. In an embodiment, the memory device detects in response to Act B0 TR(n) 630 that bank B0 is the reference bank, and that row n of B0 is the row which is being hammered. Act B0 TR(n) 630 may be provided, for example, after a delay $t_{MOD}$ which is needed for processing any mode register set command.

In an embodiment, MRS TRR enable 620, in combination with Act B0 TR(n) 630, causes the memory device to perform one or more operations in preparation for an expected future targeted row refresh of a victim row which is physically adjacent to row n of reference bank B0. To allow for performance of the one or more operations, some delay may be required between the memory device receiving Act B0 TR(n) 630 and the memory device receiving some next memory access command. Such a delay may, for example, be at least equal to (1.5)(tRAS), where tRAS is a row active time parameter. In an embodiment, tRAS is on the order of 50 nanoseconds (ns) to 70 ns.

The memory device may allow access to any of a plurality of banks at least during a period of time P1 from the memory device receiving MRS TRR enable 620 to the memory device being ready to operate in the configured mode. However, during a period of time P2 after preparations to operate in the mode, the memory device may, in an embodiment, restrict access to the reference bank—in this case bank B0—from one or more types of access which do not facilitate a targeted row refresh. In the illustrative exchange of timing diagram 600, one such targeted row refresh is represented by a command PRE B0 640 for precharging B0 and a subsequent combination of commands Act B0 TR(n−1) 650 to activate bank B0 and to perform a targeted refresh of victim row (n−1) in bank B0. Another such targeted row refresh is represented by a command PRE B0 660 for precharging B0 and a subsequent combination of commands Act B0 TR(n+1) 670 to activate bank B0 and to perform a targeted refresh of victim row (n+1) in bank B0.

During period P2, the memory device may support any of a variety of other commands (not shown) each to access a respective bank other than B0, where such access is provided before all targeted row refreshes of victim rows (n−1) and (n+1) have been completed. In an embodiment the memory device may count the number of accesses to bank B0 since the current instance of the mode was set. Based on the count, control logic of the memory device may detect that a last victim row has been refreshed and in response, automatically bring the memory device out of the mode—e.g. by writing over information which MRS TRR enable 620 wrote to a mode register. Bringing the memory device out of the mode may commence a period of time P3—e.g. after another command PRE B0 680 for precharging B0—during which read access, write access and or other types of access are again supported for bank B0. However, a delay period $t_{MOD}$ may again be required before the memory device can service a command from the memory controller.

Figure 7:
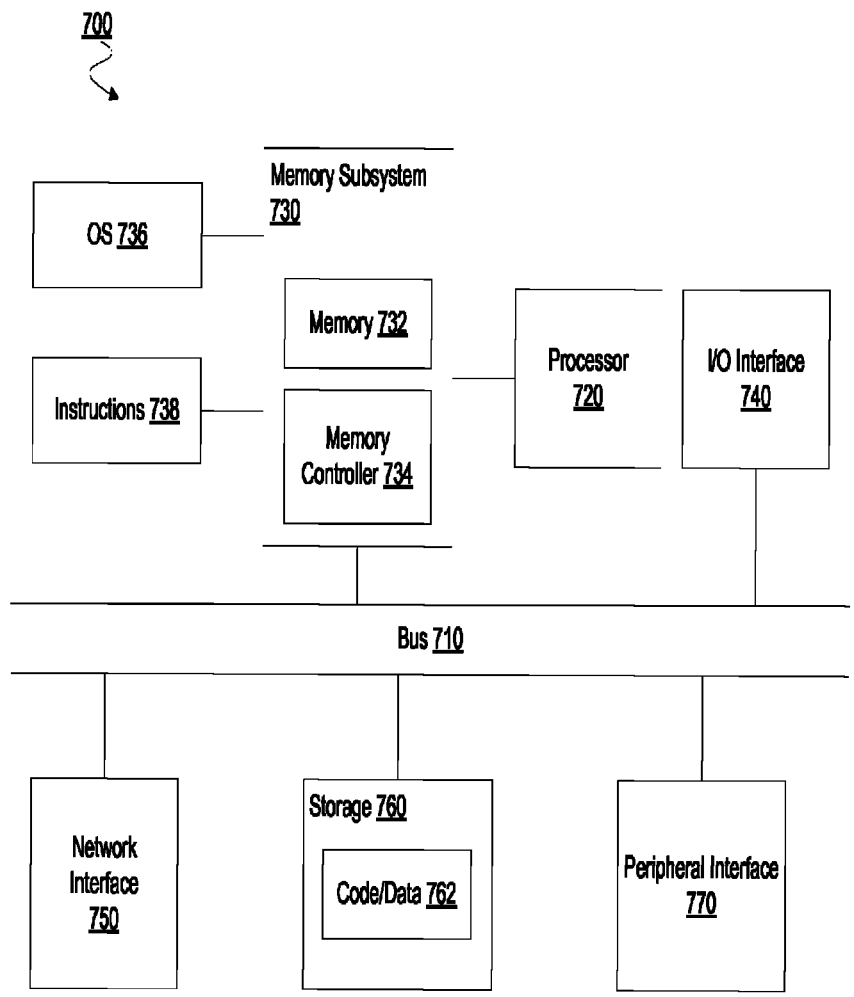
FIG. 7 is a block diagram illustrating elements of a computing system for performing targeted memory refresh according to an embodiment.

FIG. 7 is a block diagram of an embodiment of a computing system in which row hammer protection may be implemented. System 700 represents a computing device in accordance with any embodiment described herein, and may be a laptop computer, a desktop computer, a server, a gaming or entertainment control system, a scanner, copier, printer, or other electronic device. System 700 may include processor 720, which provides processing, operation management, and execution of instructions for system 700. Processor 720 may include any type of microprocessor, central processing unit (CPU), processing core, or other processing hardware to provide processing for system 700. Processor 720 controls the overall operation of system 700, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 may include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 may include memory device 732 where it stores data, instructions, programs, or other items. In one embodiment, memory subsystem includes memory controller 734, which is a memory controller in accordance with any embodiment described herein, and which provides row hammer protection mechanisms. In one embodiment, memory controller 734 provides commands to memory device 732 each based on a detected row hammer condition. The commands may be for memory device 732 to perform targeted refreshes for respective potential victim rows.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 may also correspond to interfaces in network interface 750.

System 700 may also include one or more input/output (I/O) interface(s) 740, network interface 750, one or more internal mass storage device(s) 760, and peripheral interface 770 coupled to bus 710. I/O interface 740 may include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 may include an Ethernet adapter, wireless interconnection components, USB (universal serial bus), or other wired or wireless standards-based or proprietary interfaces.

Storage 760 may be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 may be generically considered to be a "memory," although memory 730 is the executing or operating memory to provide instructions to processor 720. Whereas storage 760 is nonvolatile, memory 730 may include volatile memory (i.e., the value or state of the data is indeterminate if power is interrupted to system 700).

Peripheral interface 770 may include any hardware interface not specifically mentioned above. Peripherals refer generally to devices that connect dependently to system 700. A dependent connection is one where system 700 provides the software and/or hardware platform on which operation executes, and with which a user interacts.

Figure 8:
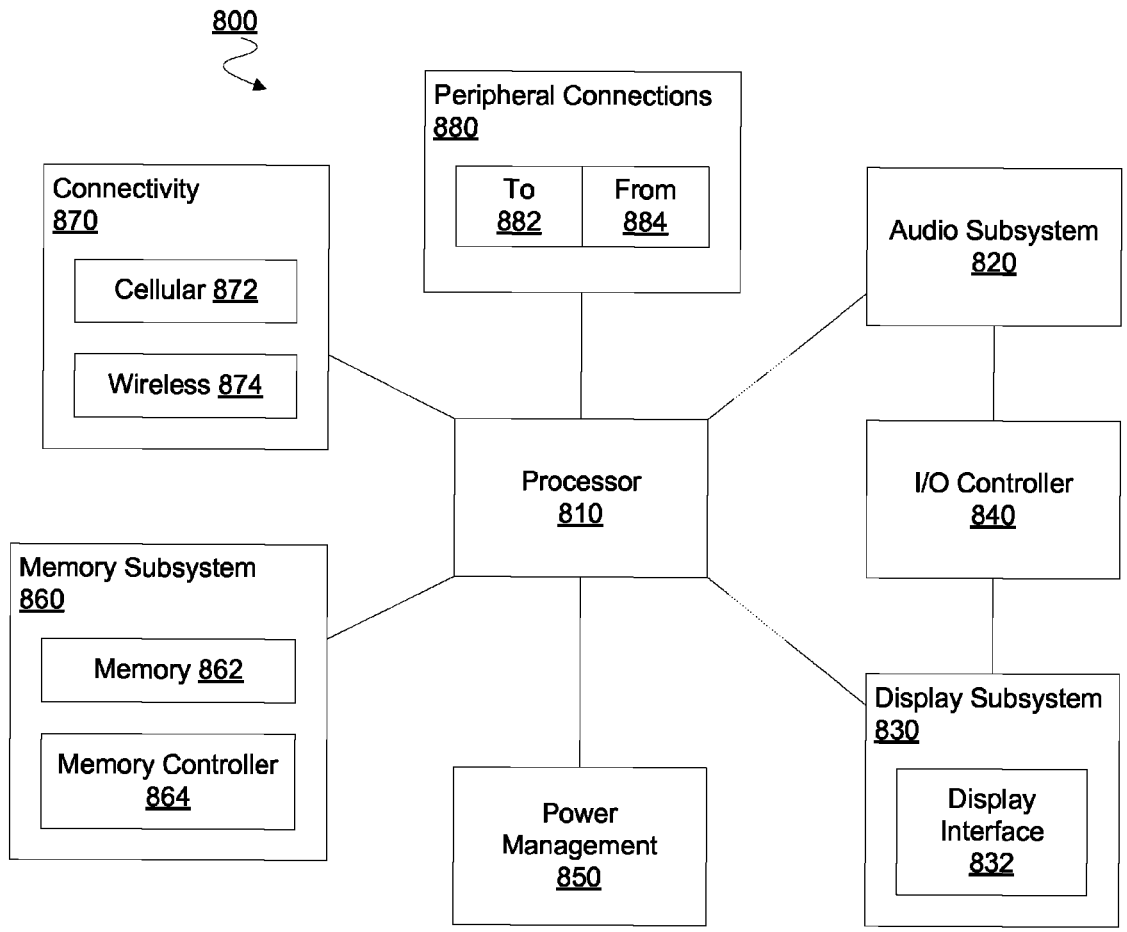
FIG. 8 is a block diagram illustrating elements of a mobile device for performing targeted memory refresh according to an embodiment.

FIG. 8 is a block diagram of an embodiment of a mobile device in which row hammer protections may be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 may include processor 810, which performs the primary processing operations of device 800. Processor 810 may include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations may also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 may include display interface 832, which may include the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 may operate to manage hardware that is part of audio subsystem 820 and/or display subsystem 830. Additionally, I/O controller 840 illustrates a connection point for additional devices that connect to device 800 through which a user might interact with the system. For example, devices that may be attached to device 800 might include microphone devices, speaker or stereo systems, video systems or other display device, keyboard or keypad devices, or other I/O devices for use with specific applications such as card readers or other devices.

As mentioned above, I/O controller 840 may interact with audio subsystem 820 and/or display subsystem 830. For example, input through a microphone or other audio device may provide input or commands for one or more applications or functions of device 800. Additionally, audio output may be provided instead of or in addition to display output. In another example, if display subsystem includes a touchscreen, the display device also acts as an input device, which may be at least partially managed by I/O controller 840. There may also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that may be included in device 800. The input may be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 may include memory device(s) 862 for storing information in device 800. Memory subsystem 860 may include nonvolatile (state does not change if power to the memory device is interrupted) and/or volatile (state is indeterminate if power to the memory device is interrupted) memory devices. Memory 860 may store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 monitors for a row hammer condition. For example, memory controller 864 may monitor the requests to certain memory addresses, and log how many times a specific address is the subject of a request. In an embodiment, memory controller 864 issues commands for targeted refreshes of potential victim rows of memory 862.

Connectivity 870 may include hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 may include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector may allow device 800 to connect to certain peripherals that allow device 800 to control content output, for example, to audiovisual or other systems.

In addition to a proprietary docking connector or other proprietary connection hardware, device 800 may make peripheral connections 880 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one aspect, a memory device comprises a first bank including a first row and a second row physically adjacent to the first row, a second bank, wherein an integrated circuit chip of the memory device includes the first bank and the second bank and detect logic to configure the memory device for operation in a first mode in response to an indication that repeated access to the first row exceeds a threshold. The memory device further comprises row hammer response logic to operate based on the first mode, including the row hammer response logic to perform, in response to the indication, one or more operations in preparation for a targeted refresh of the second row. The memory device further comprises access logic to service a first command from a memory controller after performance of the one or more operations, including the access logic to access the second bank while the memory device is configured for operation in the first mode, the access logic further to perform the targeted refresh of the second row in response to a second command received by the memory device from the memory controller after the first command.

In an embodiment, the row hammer response logic to perform the one or more operations includes the row hammer response logic to activate logic to restrict an access to the first bank other than an access for a targeted refresh. In another embodiment, the row hammer response logic to perform the one or more operations includes the row hammer response logic to determine address information corresponding to the second row. In another embodiment, the row hammer response logic to determine address information corresponding to the second row includes the row hammer response logic to determine an offset between logical addresses of physically adjacent rows.

In another embodiment, the detect logic is further to maintain a count of a number of accesses to the first bank subsequent to configuration of the memory device to operate in the first mode, the detect logic further to compare the count to a threshold number. In another embodiment, the memory device is to automatically exit the first mode in response to the count exceeding the threshold number. In another embodiment, the memory device further comprises a mode register, wherein the detect logic to configure the first mode includes the detect logic to write to the mode register. In another embodiment, the row hammer response logic is further to signal to the memory controller that repeated access to the first row exceeds the threshold.

In another aspect, a method at a memory device comprises configuring the memory device for operation in a first mode in response to an indication that repeated access to a first row exceeds a threshold. The memory device comprises a first bank including the first row and a second row physically adjacent to the first row, and a second bank, wherein an integrated circuit chip of the memory device includes the first bank and the second bank. The method further comprises, based on the first mode, performing in response to the indication one or more operations in preparation for a targeted refresh of the second row. The method further comprises servicing a first command from a memory controller after performance of the one or more operations, including accessing the second bank while the memory device is configured for operation in the first mode, and performing the targeted refresh of the second row in response to a second command received by the memory device from the memory controller after the first command.

In an embodiment, performing the one or more operations includes activating logic to restrict an access to the first bank other than an access for a targeted refresh. In another embodiment, performing the one or more operations includes determining address information corresponding to the second row. In another embodiment, determining the address information corresponding to the second row includes determining an offset between logical addresses of physically adjacent rows. In another embodiment, the method further comprises maintaining a count of a number of accesses to the first bank subsequent to configuration of the memory device to operate in the first mode, and comparing the count to a threshold number. In another embodiment, the method further comprises automatically exiting the first mode in response to the count exceeding the threshold number. In another embodiment, configuring the memory device for operation in the first mode includes writing to a mode register of the memory device. In another embodiment, the method further comprises signaling the memory controller that repeated access to the first row exceeds the threshold.

In another aspect, a memory controller comprises detect logic to receive an indication that repeated access to a first row of a memory device exceeds a threshold. The memory device comprises a first bank including the first row and a second row physically adjacent to the first row, and a second bank, wherein an integrated circuit chip of the memory device includes the first bank and the second bank. The memory controller further comprises command logic to configure the memory device for operation in a first mode in response to the indication, wherein based on the first mode, the memory device performs one or more operations in preparation for a targeted refresh of the second row. The command logic is further to send a first command, wherein the memory device accesses the second bank to service the first command after performance of the one or more operations and while the memory device is configured for operation in the first mode. The command logic is further to send a second command to the memory device after the first command is sent, wherein the memory device performs the targeted refresh of the second row in response to the second command.

In an embodiment, the indication is based on the memory device identifying the first row as a target of a row hammer event. In another embodiment, the one or more operations restrict an access to the first bank other than an access for a targeted refresh. In another embodiment, the one or more operations determine address information corresponding to the second row. In another embodiment, the command logic to configure the memory device for operation in the first mode includes the command logic to write to a mode register of the memory device. In another embodiment, the command logic is to write to the mode register information identifying the first bank as a reference bank for an instance of the mode.

In another aspect, a method at a memory controller comprises receiving an indication that repeated access to a first row of a memory device exceeds a threshold, wherein the memory device comprises a first bank including the first row and a second row physically adjacent to the first row, and a second bank, wherein an integrated circuit chip of the memory device includes the first bank and the second bank. The method further comprises configuring the memory device for operation in a first mode in response to the indication, wherein based on the first mode, the memory device performs one or more operations in preparation for a targeted refresh of the second row. The method further comprises sending a first command, wherein the memory device accesses the second bank to service the first command after performance of the one or more operations and while the memory device is configured for operation in the first mode. The method further comprises sending a second command to the memory device after the first command is sent, wherein the memory device performs the targeted refresh of the second row in response to the second command.

In an embodiment, the indication is based on the memory device identifying the first row as a target of a row hammer event. In another embodiment, the one or more operations restrict an access to the first bank other than an access for a targeted refresh. In another embodiment, the one or more operations determine address information corresponding to the second row. In another embodiment, configuring the memory device for operation in the first mode includes the memory controller writing to a mode register of the memory device. In another embodiment, the memory controller writes to the mode register information identifying the first bank as a reference bank for an instance of the mode.

Techniques and architectures for providing row hammer protection are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising a memory controller, the memory controller comprising:
    a hardware interface to couple the memory controller to a dynamic random access memory (DRAM) device, the DRAM device including a bank of memory; and
    command logic to issue multiple commands to the DRAM device in response to a number of accesses to a target row of the bank meets or exceeds a threshold within a time interval, the multiple commands including:
        a mode register set (MRS) command to set one or more configuration bits of a mode register of the DRAM device to trigger entry of the DRAM device into a targeted row refresh (TRR) mode;
        a first Activation command to be directed to a bank group including the target row when the DRAM device is in the TRR mode;
        a first Precharge command corresponding to the first Activation command to be issued at least a delay of (1.5*tRAS) after the first Activation command, wherein tRAS is a row active timing parameter; and
        two additional Activation commands and corresponding additional Precharge commands,
    wherein the multiple commands are to refresh at least one victim row physically proximate to the target row.

2. The apparatus of claim 1, wherein the mode register comprises Mode Register 2 (MR2).

3. The apparatus of claim 1, further comprising the command logic to delay issuance of other commands to the DRAM device for a mode register set command delay period of tMOD in conjunction with issuance of the MRS command to maintain the DRAM device inactive for at least tMOD.

4. The apparatus of claim 1, wherein the DRAM device includes a synchronous DRAM (SDRAM) device compliant with a dual data rate version 4 (DDR4) standard.

5. The apparatus of claim 1, further comprising:
    a DRAM device communicatively coupled to the memory controller, the DRAM device including the bank with the target row.

6. The apparatus of claim 5, wherein the DRAM device is to automatically exit the TRR mode after refresh of the at least one victim row.

7. The apparatus of claim 6, wherein the DRAM device is to count the Activation commands issued, and in response to detection of refresh of the at least one victim row, automatically clear a TRR mode configuration setting from the mode register set by the MRS command.

8. The apparatus of claim 6, wherein the command logic to further automatically delay by at least a mode register set command delay period of tMOD in conjunction with exit of the DRAM device from the TRR mode.

9. The apparatus of claim 5, further comprising one or more of:
    at least one processor communicatively coupled to the memory controller;
    a display communicatively coupled to display data from the DRAM device;
    a battery to power the apparatus; or
    a network interface communicatively coupled to exchange data stored in the DRAM device with a remote device over a network connection.

10. The apparatus of claim 1, wherein physically proximate comprises physically adjacent.

11. The apparatus of claim 1, wherein the command logic is to issue only activate and precharge commands to the bank group while the DRAM device is in the TRR mode.

12. The apparatus of claim 1, further comprising:
row hammer detect logic to detect that access to the target row meets or exceeds the threshold within the time interval.

13. The apparatus of claim 12, wherein the memory controller comprises the row hammer detect logic.

14. The apparatus of claim 12, further comprising the DRAM device coupled to the memory controller, wherein the DRAM device comprises the row hammer detect logic.

15. The apparatus of claim 1, wherein the memory controller comprises an integrated memory controller, integrated with a processor device.

16. An apparatus comprising:
a processor; and
a memory controller communicatively coupled to the processor, the memory controller including command logic to issue multiple commands to a dynamic random access memory (DRAM) device when coupled, and in response to a number of accesses to a target row of a bank of the DRAM device meets or exceeds a threshold within a time interval, the multiple commands including:
a mode register set (MRS) command to set one or more configuration bits of a mode register of the DRAM device to trigger entry of the DRAM device into a targeted row refresh (TRR) mode;
a first Activation command to be directed to a bank group including the target row when the DRAM device is in the TRR mode;
a first Precharge command corresponding to the first Activation command to be issued at least a delay of (1.5*tRAS) after the first Activation command, wherein tRAS is a row active timing parameter; and
two additional Activation commands and corresponding additional Precharge commands,
wherein the multiple commands are to refresh at least one victim row physically proximate to the target row.

17. The apparatus of claim 16, wherein the mode register comprises Mode Register 2 (MR2).

18. The apparatus of claim 16, further comprising the command logic to delay issuance of other commands to the DRAM device for a mode register set command delay period of tMOD in conjunction with issuance of the MRS command to maintain the DRAM device inactive for at least tMOD.

19. The apparatus of claim 16, wherein the DRAM device includes a synchronous DRAM (SDRAM) device compliant with a dual data rate version 4 (DDR4) standard.

20. The apparatus of claim 16, further comprising:
a DRAM device communicatively coupled to the memory controller, the DRAM device including the bank with the target row.

21. The apparatus of claim 20, wherein the DRAM device is to automatically exit the TRR mode after refresh of the at least one victim row.

22. The apparatus of claim 21, wherein the DRAM device is to count the Activation commands issued, and in response to detection of refresh of the at least one victim row, automatically clear a TRR mode configuration setting from the mode register set by the MRS command.

23. The apparatus of claim 21, wherein the command logic to further automatically delay by at least a mode register set command delay period of tMOD in conjunction with exit of the DRAM device from the TRR mode.

24. The apparatus of claim 20, further comprising one or more of:
a display communicatively coupled to display data from the DRAM device;
a battery to power the apparatus; or
a network interface communicatively coupled to exchange data stored in the DRAM device with a remote device over a network connection.

25. The apparatus of claim 16, wherein physically proximate comprises physically adjacent.

26. The apparatus of claim 16, wherein the command logic is to issue only activate and precharge commands to the bank group while the DRAM device is in the TRR mode.

27. The apparatus of claim 16, further comprising:
row hammer detect logic to detect that access to the target row meets or exceeds the threshold within the time interval.

28. The apparatus of claim 27, wherein the memory controller comprises the row hammer detect logic.

29. The apparatus of claim 27, further comprising the DRAM device coupled to the memory controller, wherein the DRAM device comprises the row hammer detect logic.

30. The apparatus of claim 16, wherein the memory controller comprises an integrated memory controller, integrated with a processor device.

31. A method at a memory controller, comprising:
issuing a mode register set (MRS) command to set one or more configuration bits of a mode register of a dynamic random access memory (DRAM) device to trigger entry of the DRAM device into a targeted row refresh (TRR) mode, in response to a number of accesses to a target row of a bank of the DRAM device meets or exceeds a threshold within a time interval;
issuing a first Activation command to a bank group including the target row when the DRAM device is in the TRR mode;
issuing a first Precharge command corresponding to the first Activation command after a delay of at least (1.5*tRAS) after the first Activation command, wherein tRAS is a row active timing parameter; and
issuing two additional Activation commands and corresponding additional Precharge commands,
wherein the Activation commands and corresponding Precharge commands are to refresh at least one victim row physically proximate to the target row.

32. The method of claim 31, wherein issuing the MRS command comprises issuing an MRS command to set one or more configuration bits of Mode Register 2 (MR2).

33. The method of claim 31, further comprising:
delaying issuance of the first Activation command for a mode register set command delay period of tMOD after issuing the MRS command to trigger entry into the TRR mode.

34. The method of claim 31, further comprising:
delaying by at least a mode register set command delay period of tMOD after issuing the two additional Activation and corresponding additional Precharge commands prior to issuance of another command to the DRAM device, wherein the DRAM device is to automatically exit the TRR mode after refresh of the at least one victim row.

35. The method of claim 34, further comprising the DRAM device to count a number of refreshes at the DRAM device during TRR mode, and clear a TRR mode configuration setting set by the memory controller in response to detection by the DRAM device that the at least one victim row has been refreshed.

36. The method of claim 31, wherein the DRAM device includes a synchronous DRAM (SDRAM) device compliant with a dual data rate version 4 (DDR4) standard.

37. The method of claim 31, further comprising:
   detecting, by the memory controller, that the number of accesses to the target row meets or exceeds the threshold within the time interval.

38. The method of claim 31, further comprising:
   detecting, by the DRAM device, that the number of accesses to the target row meets or exceeds the threshold within the time interval.

* * * * *